(12) United States Patent
Baudot

(10) Patent No.: US 11,604,371 B2
(45) Date of Patent: Mar. 14, 2023

(54) ELECTRO-OPTICAL MODULATOR AND METHODS OF FORMATION THEREOF

(71) Applicant: STMicroelectronics (Crolles 2) SAS, Crolles (FR)

(72) Inventor: Charles Baudot, Lumbin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/661,356

(22) Filed: Apr. 29, 2022

(65) Prior Publication Data

US 2022/0252912 A1 Aug. 11, 2022

Related U.S. Application Data

(62) Division of application No. 16/539,503, filed on Aug. 13, 2019, now Pat. No. 11,327,346.

(30) Foreign Application Priority Data

Aug. 31, 2018 (FR) ........................ 1857846

(51) Int. Cl.
| | |
|---|---|
| *G02F 1/025* | (2006.01) |
| *G02F 1/01* | (2006.01) |
| *G02F 1/017* | (2006.01) |
| *G02F 1/225* | (2006.01) |
| *H01L 21/02* | (2006.01) |
| *B82Y 20/00* | (2011.01) |

(52) U.S. Cl.
CPC ............ *G02F 1/025* (2013.01); *G02F 1/0121* (2013.01); *G02F 1/01708* (2013.01); *G02F 1/01716* (2013.01); *G02F 1/01725* (2013.01); *G02F 1/225* (2013.01); *H01L 21/0245* (2013.01);

(Continued)

(58) Field of Classification Search
CPC .... G02F 1/025; G02F 1/0121; G02F 1/01708; G02F 1/01716; G02F 1/01725; G02F 1/225; G02F 1/01791; G02F 1/017; G02F 1/035; H01L 21/02381; H01L 21/0245; B82Y 20/00
See application file for complete search history.

(56) References Cited

U.S. PATENT DOCUMENTS

| | | | |
|---|---|---|---|
| 4,943,144 A | 7/1990 | Delacourt et al. | |
| 5,661,740 A * | 8/1997 | Dutta | ............... H01S 5/0607 257/14 |
| 7,650,049 B2 | 1/2010 | David et al. | |

(Continued)

FOREIGN PATENT DOCUMENTS

| | | |
|---|---|---|
| CN | 101116025 A | 1/2008 |
| CN | 102169243 A | 8/2011 |

(Continued)

OTHER PUBLICATIONS

Chaisakul, Papichaya, et al., "O-band quantum-confined Stark effect optical modulator from Ge/Si0.15Ge0.85 quantum wells by well thickness tuning," Journal of Applied Physics 116, 193103, 2014, 6 pages.

(Continued)

*Primary Examiner* — John Bedtelyon
(74) *Attorney, Agent, or Firm* — Slater Matsil, LLP

(57) ABSTRACT

In one embodiment, an electro-optical modulator includes a waveguide having a first major surface and a second major surface opposite the first major surface. A cavity is disposed in the waveguide. Multiple quantum wells are disposed in the cavity.

20 Claims, 4 Drawing Sheets

(52) U.S. Cl.
CPC ........ *H01L 21/02381* (2013.01); *B82Y 20/00* (2013.01)

(56) References Cited

U.S. PATENT DOCUMENTS

| | | | | |
|---|---|---|---|---|
| 8,401,345 | B2* | 3/2013 | Zheng | G02B 6/1228 385/2 |
| 9,470,952 | B2 | 10/2016 | Dagli | |
| 9,864,136 | B1* | 1/2018 | Jacob | H01L 31/02327 |
| 9,952,456 | B2 | 4/2018 | Huang | |
| 10,643,903 | B2* | 5/2020 | Drake | H01L 21/8258 |
| 11,150,494 | B2* | 10/2021 | Yu | G02B 6/136 |
| 2008/0232735 | A1 | 9/2008 | Miller et al. | |
| 2010/0314682 | A1* | 12/2010 | Yilmaz | H01L 29/66348 257/E21.546 |
| 2012/0309195 | A1* | 12/2012 | Masuda | H01L 29/8613 438/701 |
| 2013/0277541 | A1* | 10/2013 | Ikemoto | H01L 27/14629 250/227.11 |
| 2018/0212399 | A1 | 7/2018 | Menezo et al. | |

FOREIGN PATENT DOCUMENTS

| | | |
|---|---|---|
| CN | 105308488 A | 2/2016 |
| CN | 105593747 A | 5/2016 |
| CN | 106569350 A | 4/2017 |
| EP | 0306400 A1 | 3/1989 |
| EP | 0477072 A1 | 3/1992 |
| EP | 3352312 A1 | 7/2018 |
| FR | 2741195 A1 | 5/1997 |

OTHER PUBLICATIONS

Guy, D. R. P., et al., "Theory of an Electro-Optic Modulator Based on Quantum Wells in a Semiconductor etalon," Proceedings of SPIE, Aug. 11, 1987, 9 pages.

Kuo, Yu-Hsuan, et al., "Quantum-Confined Stark Effect in Ge/SiGe Quantum Wells on Si for Optical Modulators," IEEE Journal of Selected Topics In Quantum Electronics, vol. 12, No. 6, Nov./Dec. 2006, 11 pages.

Kuo, Yu-Hsuan, et al., "Strong quantum-confined Stark effect in germanium quantum-well structures on silicon," Nature, vol. 437, Oct. 27, 2005, 3 pages.

Liu, Jifeng et al., "Design of monolithically integrated GeSi electro-absorption modulators and photodetectors on an SOI platform," Optics Express, Jan. 22, 2007, vol. 15, No. 2, 6 pages.

Tasmin, Tania, et al., "Design of SiGe/Si Quantum-Well Optical Modulators," The University of British Columbia, Aug. 2010, 117 pages.

* cited by examiner

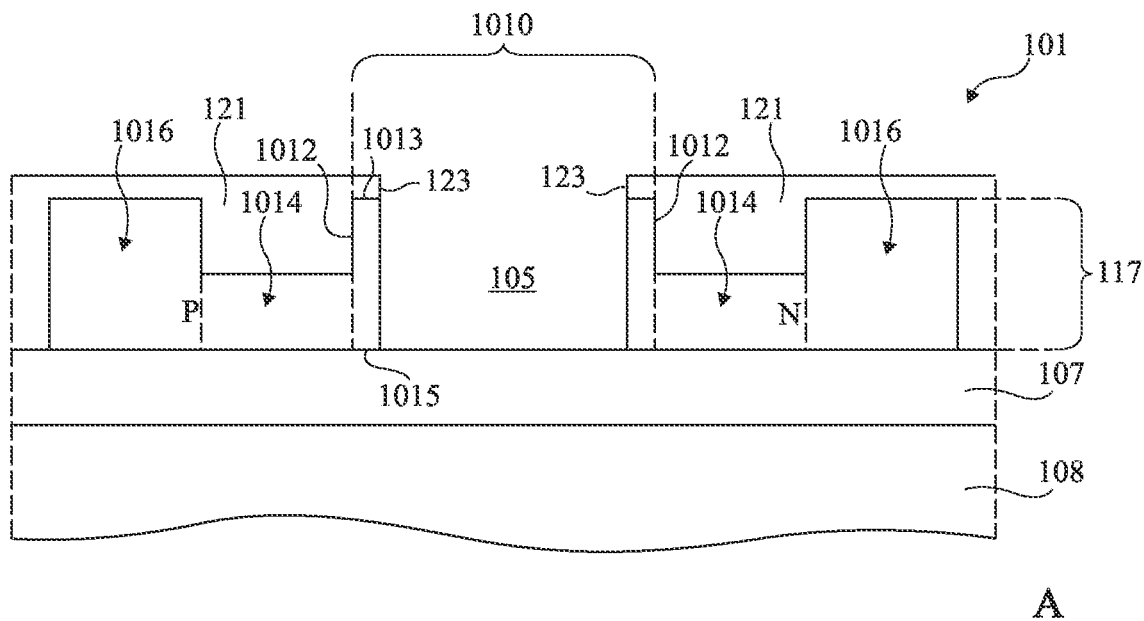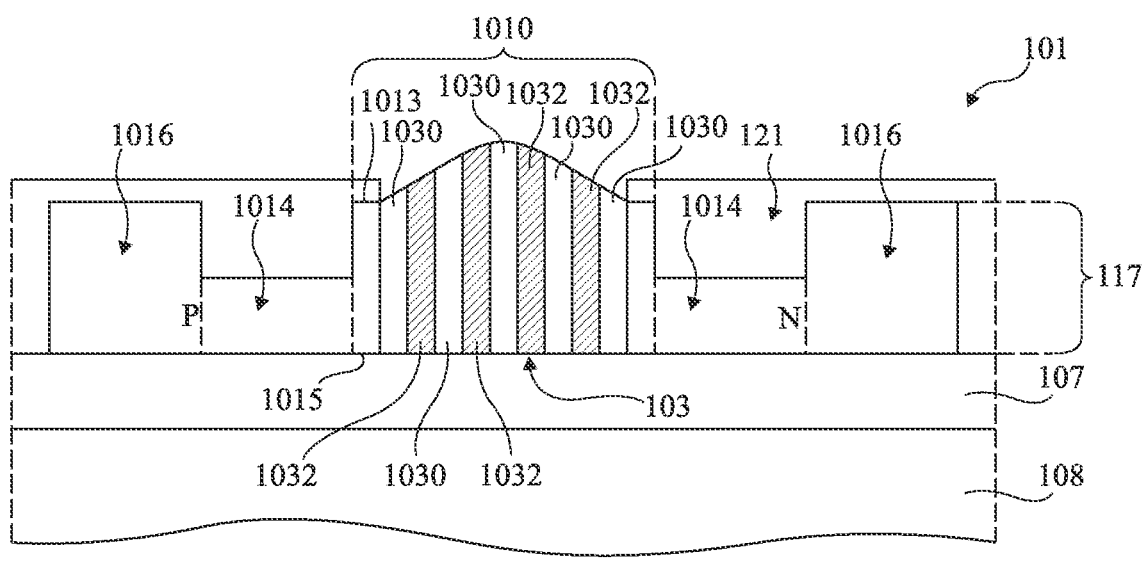
Fig 4

ELECTRO-OPTICAL MODULATOR AND METHODS OF FORMATION THEREOF

CROSS-REFERENCE TO RELATED APPLICATIONS

This application is a divisional application of U.S. application Ser. No. 16/539,503, filed on Aug. 13, 2019, which claims the priority benefit of French patent application number 1857846, filed on Aug. 31, 2018, which applications are hereby incorporated by reference in their entirety.

TECHNICAL FIELD

The present disclosure generally relates to photonic (optical and/or optoelectronic) circuits, and more generally to electro-optical modulators and methods of formation thereof.

BACKGROUND

Electro-optical absorption modulators where, according to the polarization of a material crossed by an optical signal, the absorption coefficient of the material, and thus, the optical power of the signal, is modulated, are known.

SUMMARY

It would be desirable to have an electro-optical absorption modulator and a method of manufacturing such a modulator overcoming all or part of the disadvantages of known electro-optical absorption modulators and of their manufacturing methods.

An embodiment provides a method of manufacturing an electro-optical absorption modulator compatible with integrated circuit manufacturing techniques, particularly of CMOS type.

An embodiment provides an electro-optical absorption modulator where losses are lighter than in known electro optical modulators.

An embodiment provides an electro-optical modulator more compact than known electro-optical modulators.

An embodiment provides an electro-optical absorption modulator capable of modulating the optical power of a signal having a wavelength or wavelengths in the order of 1,310 nm.

Thus, an embodiment provides an electro-optical modulator comprising a waveguide comprising multiple quantum wells in a cavity of the waveguide.

According to an embodiment, the cavity crosses the waveguide transversely.

According to an embodiment, the cavity emerges at the level of a lower surface of the waveguide.

According to an embodiment, the cavity has walls inclined with respect to the normal to the lower surface of the waveguide.

According to an embodiment, the waveguide comprises two semiconductor regions, preferably made of silicon, on either side of the cavity, the two regions being doped with different conductivity types.

According to an embodiment, the multiple quantum wells are formed by an alternation of first quantum barrier layers and of second quantum well layers.

According to an embodiment, the first layers are made of silicon-germanium, the second layers being made of germanium.

According to an embodiment, each of the first and second layers is flush with the lower surface of the waveguide.

According to an embodiment, the waveguide rests on and is in contact with a third layer, the third layer being preferably an insulating layer of a structure of semiconductor-on-insulator type.

According to an embodiment, the waveguide comprises a band configured to guide an optical signal propagating through the waveguide.

According to an embodiment, the cavity crosses the band.

An embodiment provides a photonic circuit comprising a modulator such as defined hereabove.

Another embodiment provides a method of manufacturing a modulator such as defined hereabove, the method comprising the successive steps of: a) etching a through cavity into a waveguide; and b) filling the cavity by forming multiple quantum wells therein.

According to an embodiment, step b) comprises the successive steps of: b1) forming, in the cavity, a first layer of a first material by selective epitaxy from the material of the waveguide;

b2) forming, in alternation, a layer of a second material and a layer of the first material by epitaxy from the previous layer.

According to an embodiment, the method comprises, after step b), an at least partial step of chemical mechanical polishing of the portions of the layers of the first and of second materials protruding from the waveguide.

The foregoing and other features and advantages will be discussed in detail in the following non-limiting description of specific embodiments in connection with the accompanying drawings.

BRIEF DESCRIPTION OF THE DRAWINGS

FIG. 4 shows partial simplified cross section views A and B illustrating steps of an embodiment of a method of manufacturing an electro-optical modulator.

DETAILED DESCRIPTION OF ILLUSTRATIVE EMBODIMENTS

Figure 1:
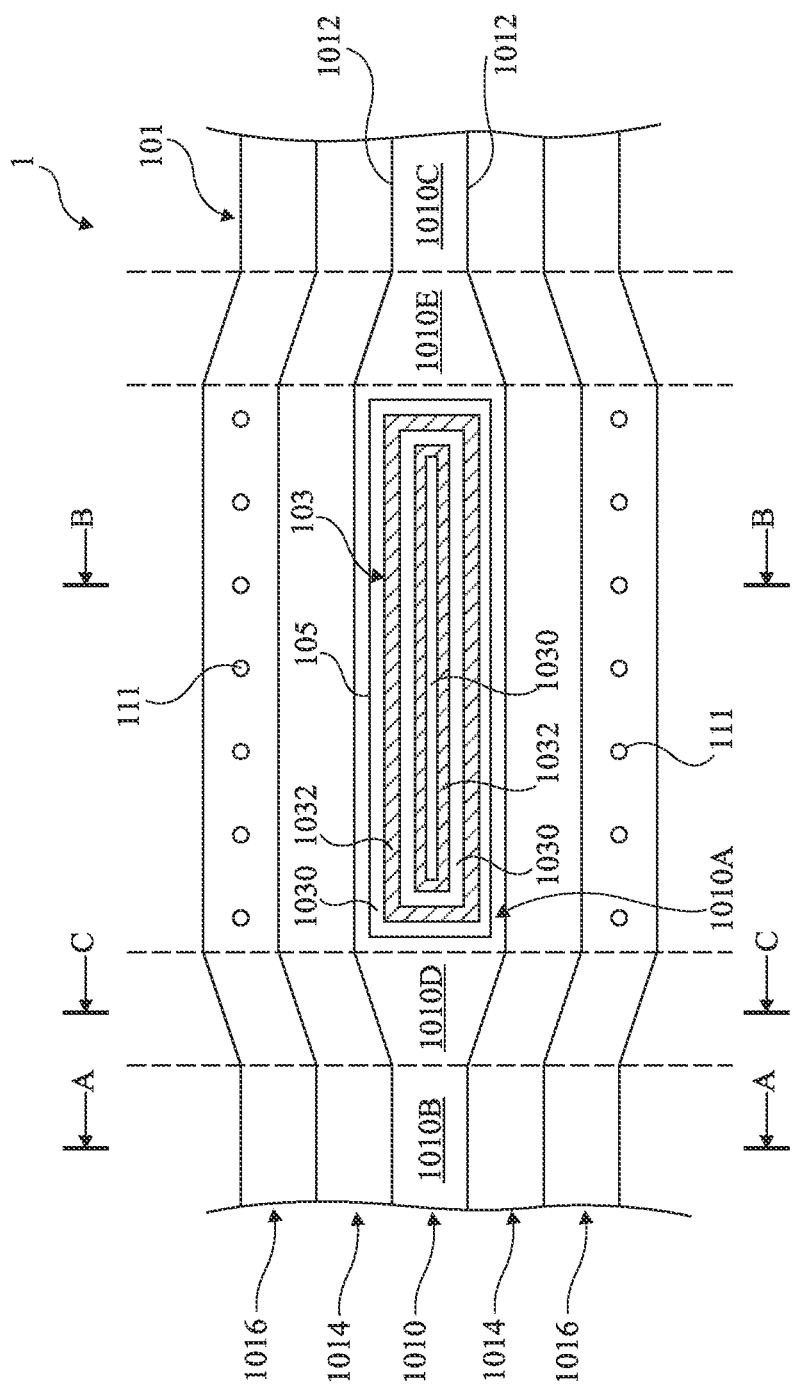
FIG. 1 is a partial simplified top view of an embodiment of an electro-optical modulator.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the photonic circuits where an electro-optical modulator can be provided have not been detailed, the modulators described hereafter being compatible with most photonic circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

In the following description, when reference is made to a transverse cross-section, unless otherwise specified, the transverse cross-section is orthogonal to the longitudinal direction of a waveguide.

In the following description, an electro-optical modulator configured to modulate the optical power of a light signal having a wavelength or wavelengths approximately equal to 1,310 nm, preferably equal to 1,310 nm, is considered. The dimensions and the materials of the waveguide indicated hereafter as an example are selected for such wavelengths, it being understood that it is within the abilities of those skilled in the art, in the light of the following description, to adapt the dimensions and materials to other wavelengths.

FIG. 1 is a partial simplified top view of an embodiment of an electro-optical modulator 1.

Figure 2:
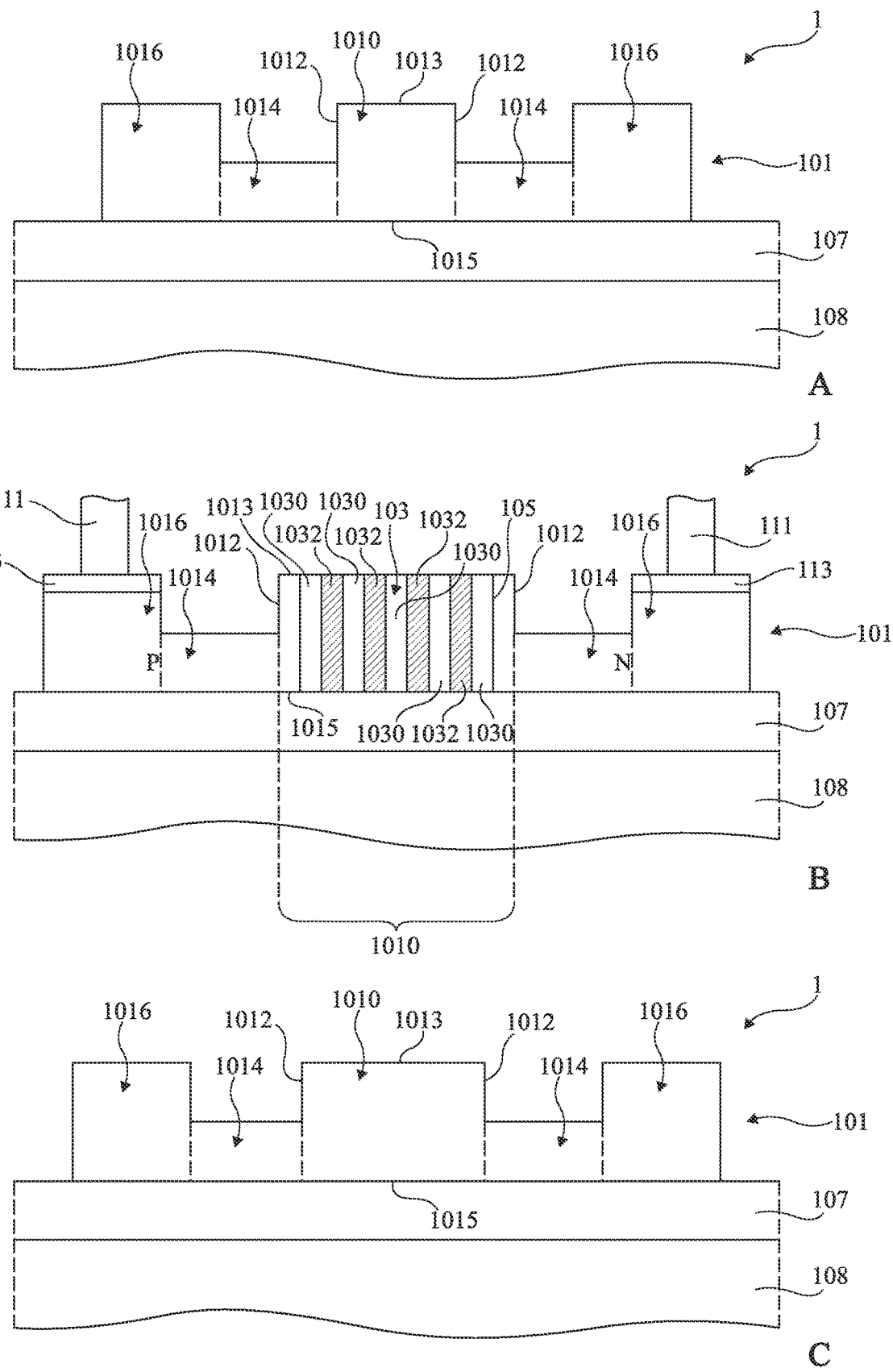
FIG. 2 shows partial simplified cross section views A, B, and C of the modulator of FIG. 1, along respective planes AA, BB, and CC of FIG. 1.

FIG. 2 shows partial simplified cross-section views A, B, and C of modulator 1 of FIG. 1, along respective planes AA, BB, and CC of FIG. 1.

Modulator 1 comprises a waveguide 101. Waveguide 101 comprises a band 1010, for example, made of silicon. Band 1010 for example has a rectangular transverse cross-section having dimensions, that is, a width (between lateral surfaces 1012 of the band) and a thickness (between upper 1013 and lower 1015 surfaces of the band, FIG. 2), preferably selected so that a signal intend to be propagated in waveguide 101 remains confined within the band.

The modulator further comprises multiple quantum wells 103 in a cavity 105 of waveguide 101.

Cavity 105 extends vertically, that is, in a direction orthogonal to lower surface 1015 of waveguide 101, across the entire thickness of waveguide 101. More particularly, band 1010 comprises, lengthwise, an intermediate portion 1010A (delimited by vertical dotted lines in FIG. 1) vertically crossed by cavity 105. Thus, the cavity emerges at the level of the lower surface 1015 of band 1010 and at the level of the upper surface 1013 of band 1010. The cavity is vertically surrounded with the material of band 1010 or, in other words, in cross-section planes parallel to lower surface 1015 of waveguide 101, cavity 105 is totally surrounded with the material of band 1010. In cross-section planes parallel to lower surface 1015 of waveguide 101, cavity 105 is preferably elongated in the main (longitudinal) direction of waveguide 101, for example with a rectangular shape.

In this embodiment, cavity 105 has vertical walls substantially orthogonal, preferably orthogonal, to lower surface 1015 of waveguide 101.

Multiple quantum wells 103 are formed by an alternation of quantum barrier layers 1030, for example, made of silicon-germanium, preferably with a germanium concentration of at least 85%, and of quantum well layers 1032, for example, made of germanium. Cavity 105 is totally filled with layers 1030 and 1032. More particularly, in cavity 105, each layer 1030 and 1032, except for the layer 1030 or 1032 arranged against the vertical walls of cavity 105, is vertically surrounded with a layer, respectively 1032 or 1030. In other words, in cross-section planes parallel to lower surface 1015 of waveguide 101, each layer 1030 and 1032 forms a ring, each layer 1032 being preferably interposed between two layers 1030. Each layer 1030 and 1032 is flush with the level of lower surface 1015 of waveguide 101. In the shown embodiment, each layer 1030 and 1032 is flush with upper surface 1013 of waveguide 101. In an alternative embodiment, not shown, portions of layers 1030 and 1032 may protrude from upper surface 1013 of waveguide 101.

In the shown embodiment, intermediate portion 1010A of band 1010 has a transverse cross-section wider than that of upstream portion 1010B and downstream portion 1010C respectively arranged upstream (for example, to the left in FIG. 1) and downstream (for example, on the right-hand side in FIG. 1) of the intermediate portion 1010A with respect to the propagation direction of a signal in waveguide 101. In this specific embodiment, band 1010 comprises (FIG. 1), lengthwise, upstream portion 1010B, an optional upstream intermediate portion 1010D, intermediate portion 1010A crossed by cavity 105, an optional downstream intermediate portion 1010E, and downstream portion 1010C. Portions 1010B, 1010D, 1010A, 1010E, and 1010C (delimited by vertical dotted lines in FIG. 1) are end-to-end. To limit, or even to suppress, spurious reflections of an optical signal propagating from upstream portion 1010B to downstream portion 1010C, waveguide 101 is here configured so that its effective optical index, for a given optical mode of a signal propagating through waveguide 101, varies progressively from or all the way to intermediate portion 1010A. The effective index of an optical mode is defined as being the ratio of the propagation constant of this mode to the wave vector in vacuum at the considered wavelength. The progressive variation of the effective index is for example obtained due to progressive variations of the width of optional upstream intermediate portion 1010D from upstream portion 1010B to intermediate portion 1010A, and of optional downstream intermediate portion 1010E from intermediate portion 1010A to downstream portion 1010C, as shown in FIG. 1.

In an alternative embodiment, not illustrated, optional downstream/upstream intermediate portions 1010D and 1010E are omitted, portions 1010B, 1010A, and 1010C being then end-to-end. As a result, the waveguide is simpler to manufacture. In this variation, the dimensions of the transverse cross-sections of portions 1010B, 1010A, and 1010C are preferably identical.

In this embodiment, waveguide 101 comprises two strips 1014, preferably made of the same material as band 1010, on either side of band 1010. Band 1010 and strips 1014 have identical main (longitudinal) directions. Each strip 1014 is in contact with a different lateral surface 1012. The thickness of strips 1014, for example, measured in a direction orthogonal to lower surface 1015 of band 1010, is smaller than the thickness of band 1010, for example, approximately equal, preferably equal, to half the thickness of band 1010.

In this embodiment, waveguide 101 further comprises, at least along cavity 105, two optional bands 1016, preferably made of the same material as band 1010. Bands 1016 are arranged along strips 1014. Each band 1016 is in contact with a different strip 1014. Bands 1016 have main (longitudinal) directions identical to those of band 1010 and of strips 1014. The thickness of bands 1016 is for example substantially equal, preferably equal, to the thickness of band 1010.

Waveguide 101 is embedded in a material, for example silicon oxide, having an optical index different from that of band 1010. In the shown example, waveguide 101 rests on top of and in contact with a layer 107 (FIG. 2), for example, a silicon oxide layer. Preferably, layer 107 forms the insulating layer of a structure of semiconductor-on insulator type (SOI) and for example rests on a support 108 (FIG. 2) such as a silicon substrate. A layer, not shown, preferably made of the same material as layer 107, covers waveguide 101.

Modulator 1 comprises contacts, in this example conductive vias 111, arranged along and on either side of cavity 105. Vias 111 are in contact with conductive and/or semiconductor regions of waveguide 101 laterally extending from cavity 105 to enable to apply a control voltage to multiple quantum wells 103. In the shown example, vias 111 cross the layer (not shown) covering the waveguide all the way to the upper surface of bands 1016. Further, in the shown example, the silicon of bands 1010 and 1016 and of strips 1014 is, in transverse cross-section, doped with a first conductivity type, for example, type P, on one side of cavity 105 (on the left-hand side in FIG. 2, view B) and with a second conductivity type, for example, type N, on the other side of cavity 105 (on the right-hand side in FIG. 2, view B). Preferably, the top of bands 1016 is made of silicide 113 (FIG. 2), at least at the level of the contacts with vias 1111.

In operation, a control voltage is applied between the vias 1111 arranged on one side of cavity 105 and the vias 1111 arranged on the other side of cavity 105. An optical signal is supplied to waveguide 101 and propagates in guided fashion in band 1010, quantum wells 103 being crossed by the signal. For a zero control voltage, quantum wells 103 are not absorbing. In other words, the power of the optical signal entering portion 1010A is substantially equal to that of the signal coming out of portion 1010A. However, for a non-zero control voltage, the quantum wells become absorbing. As a result, the power of the optical signal entering portion 1010A is decreased, for example, by at least 3 dB, preferably by at least 3 dB with respect to the power of the signal entering portion 1010A.

Figure 3:
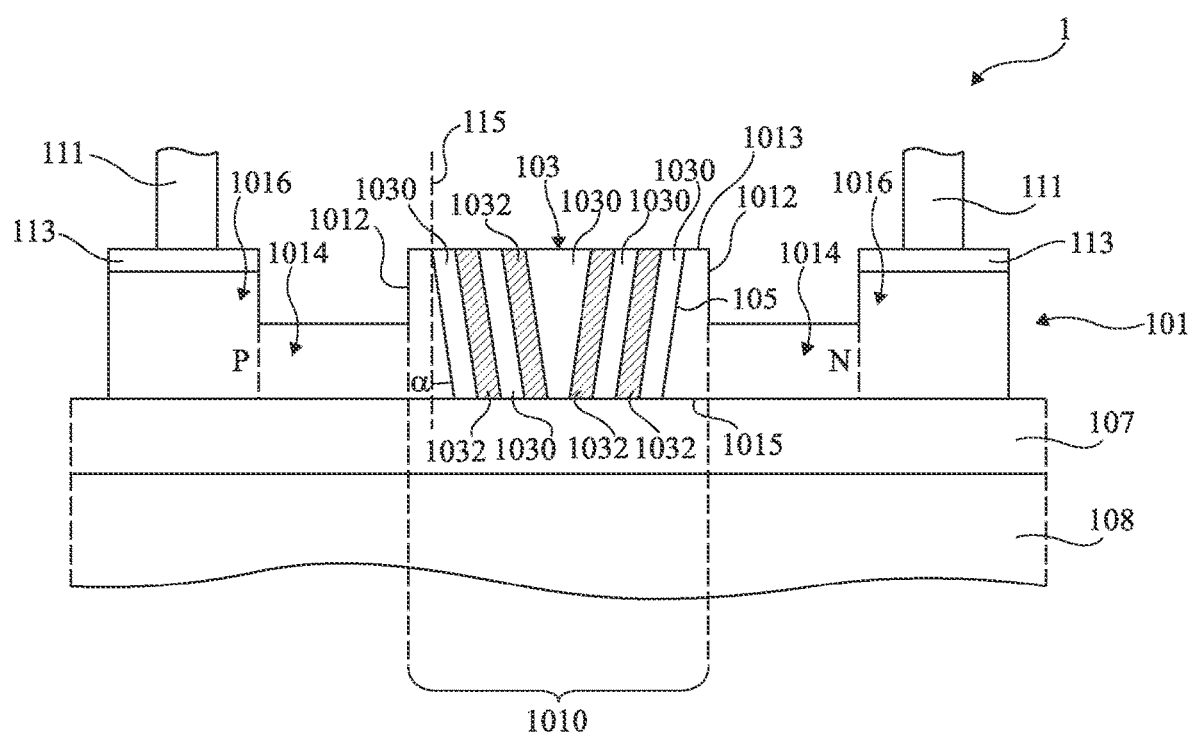
FIG. 3 is a partial simplified cross section view of an alternative embodiment of the modulator of FIG. 1, along plane BB of FIG. 1.

FIG. 3 is a partial simplified cross-section view of an alternative embodiment of modulator 1 of FIG. 1, along plane BB of FIG. 1.

The modulator of FIG. 3 differs from that described in relation with FIG. 2 in that the vertical walls of cavity 105 are inclined with respect to normal 115 to the lower surface 1015 of waveguide 101. Preferably, cavity 105 is flared on the side of upper surface 1013 of waveguide 101. As an example, angle α between normal 115 and each of the walls of cavity 105 is in the range from 5 to 20°, for example, substantially equal to 10°, preferably equal to 10°. Preferably, angle α is identical for each wall of the cavity.

As compared with an electro-optical absorption modulator which would comprise a stack of quantum barrier layers and of quantum well layers on an intermediate layer resting on the upper surface of band 1010, modulator 1 is more compact, particularly thinner. Further, in such a modulator, the optical signal to be modulated should come out of the band, cross the intermediate layer, cross the quantum wells, cross again the intermediate layer before reaching the band, which would result in greater optical losses than in modulator 1 where the multiple quantum wells are arranged in band 1010, directly in the way of the light signal. Further, in such a modulator, the forming of contacts to apply a control voltage to the multiple quantum wells would be more complex than in modulator 1.

FIG. 4 shows partial simplified cross-section views A and B illustrating steps of an embodiment of a method of manufacturing an electro-optical modulator, for example, modulator 1 of FIGS. 1 and 2. It should be noted that views A and B are taken in a plane corresponding to plane BB of FIG. 1.

At the step illustrated in FIG. 4, in view A, waveguide 101 has been defined by etching into a layer 117, for example, a silicon layer, here resting on a layer 107, for example, a silicon oxide layer. Preferably, layers 117 and 107 respectively correspond to the semiconductor layer and to the insulating layer of an SOI-type structure.

A portion of waveguide 101 extending lengthwise on all or part of the length of the location where cavity 105 is desired to be formed has been doped with a first doping type, for example, type P (on the left-hand side of FIG. 4) on one side of this location, and with a second doping type, for example, type N (on the right-hand side in FIG. 4) on the other side of this location.

Cavity 105 has then been etched into band 1010 of waveguide 101. More particularly, in this example, a masking layer 121, preferably made of silicon oxide, has been deposited to cover waveguide 101 and an opening 123 has been etched into layer 121, opposite the location where cavity 105 is desired to be formed. Band 1010 has then been etched through opening 123, across its entire thickness, the etching being preferably stopped on layer 107. As an example, opening 123 in layer 121 may be formed by etching layer 121 through a corresponding opening of a mask, for example, made of resin, deposited on layer 121.

Thus, as shown in FIG. 4, view A, cavity 105 is, in transverse cross-section, laterally bordered on one side by a P-type semiconductor region and on the other side by an N-type semiconductor region.

In an alternative embodiment, not illustrated, the steps of doping waveguide 101 may be carried out after the etching of cavity 105.

In another alternative embodiment, not illustrated, when a modulator 1 of the type described in relation with FIG. 3 is desired to be manufactured, the etching of band 1010 through opening 123 is performed so that cavity 105 is flared towards upper surface 1013 of band 1010.

At the step illustrated in FIG. 4, view B, multiple quantum wells 103 have been formed in cavity 105, to totally fill cavity 105. More particularly, a first quantum barrier layer 1030 is formed by selective epitaxy from the exposed material of band 1010. Thus, in cavity 105, first layer 1030 totally covers the material of band 1010, but does not cover the bottom of the cavity, although it is in contact therewith. A first quantum well layer 1032 is then formed by selective epitaxy from the material of first layer 1030. Layers 1030 and 1032 are alternately formed by selective epitaxy from the material of the last layer, respectively 1032 and 1030, formed in cavity 105, to fill cavity 105 with an alternation of layers 1030 and 1032. Preferably, the width of cavity 105 and/or the thickness and the number of layers 1030 and 1032 is selected so that the last layer formed in the cavity is a layer 1030 or, in other words, the central layer in the cavity is a layer 1030.

In an alternative embodiment, not illustrated, the first layer formed by selective epitaxy from the material of band 1010, exposed at the level of the lateral walls of cavity 105, is a quantum well layer 1032. Layers 1030 and 1032 are then alternately formed by selective epitaxy from the material of the last layer, respectively 1032 and 1030, formed in cavity 105, to fill cavity 105.

In the case, not illustrated, where the walls of cavity 105 are inclined, a decrease in the number of dislocations in the material of the last layer formed in cavity 105, and between the material of band 1010 and the material of the first layer formed in the cavity, can be observed. The decrease in the number of dislocations causes a decrease in the disturbances of an optical signal crossing multiple quantum wells 103.

As shown in FIG. 4, view B, portions of layers 1030 and 1032 may protrude from upper surface 1013 of waveguide 101. Thus, at a subsequent step, not illustrated, it may be provided to at least partially remove, preferably to integrally remove, these portions of layers 1030 and 1032, for example, by chemical mechanical polishing, preferably all the way to upper surface 1013 of band 1010.

At subsequent steps, not illustrated, conductive vias 111 are formed through layer 121, all the way to the top of strips 1014. According to a specific embodiment, to form vias 111, a layer of the same material as layer 121 is deposited to cover waveguide 101 and layers 1030 and 1032. Holes are etched, into this material, down to the top of bands 1016, at the locations where vias 111 are desired to be formed. The exposed portion of bands 1016 may then be silicided. Vias 111 are then obtained by filling the holes with a conductive material.

Although a single modulator 1 is shown in FIG. 4, a plurality of modulators 1 may be formed simultaneously, for example, at different locations of a same plate, for example, an SOI-type plate, and the plate may then be cut to obtain a plurality of individualized photonic integrated circuits.

As a specific embodiment, an electro-optical modulator 1 with the following dimensions is provided, where width of upstream portion 1010B and downstream portion 1010C is in the range from 200 to 1,000 nm, for example, equal to approximately 400 nm, preferably equal to 400 nm. The width of portion 1010A in the range from 500 to 2,300 nm, for example, approximately equal to approximately 800 nm, preferably equal to 800 nm. The width of cavity 105 in the range from 400 to 2,000 nm, for example, equal to approximately 600 nm, preferably equal to 600 nm. The length of cavity 105 in the range from 20 to 140 µm, for example, equal to approximately 40 µm, preferably equal to 40 µm. The thickness of band 1010 in the range from 220 to 500 nm, preferably equal to approximately 300 nm, for example, equal to 300 nm. The width of strips 1014 in the range from 400 to 1,800 nm, for example, equal to approximately 1,000 nm, preferably equal to 1,000 nm. The thickness of strips 1014 in the range from 50 to 160 nm, for example, equal to approximately 150 nm, preferably equal to 150 nm. The thickness of layers 1030 in the order of 16 nm, preferably equal to 16 nm and thickness of layers 1032 in the order of 10 nm, preferably equal to 10 nm.

Various embodiments and variations have been described. It will be understood by those skilled in the art that certain features of these various embodiments and variations may be combined, and other variations will occur to those skilled in the art. In particular, it is within the abilities of those skilled in the art to modify the dimensions and the materials indicated hereabove as an example to obtain modulators capable of modulating optical signals at other wavelengths than those indicated hereabove. For example, to modulate optical signals at wavelengths greater than 1,550 nm, the quantum barrier layers may be made of an alloy of tin and germanium and the quantum well layers may be made of germanium.

Finally, the practical implementation of the described embodiments and variations is within the abilities of those skilled in the art based on the functional indications given hereabove. In particular, the dimensions and/or the materials of the described modulators may be determined by those skilled in the art based on simulation tools, for example, simulation tools using finite difference time domain calculations (FDTD). An example of such a simulation tool is commercialized by company "Lumerical".

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A method of manufacturing an electro-optical modulator comprising a waveguide, the method comprising:
    etching a cavity into the waveguide, wherein etching the cavity comprises etching the cavity with slanted sidewalls; and
    filling the cavity by forming multiple quantum wells by an epitaxial deposition process.

2. The method of claim 1, wherein filling the cavity comprises:
    forming, in the cavity, a first layer of a first material by selective epitaxy from the material of the waveguide; and
    alternately forming a layer of a second material and a layer of the first material by epitaxy from the layer of the second material.

3. The method of claim 2, wherein the first material is silicon-germanium and the second material is germanium, and the waveguide comprises silicon.

4. The method of claim 2, further comprising:
    planarizing the multiple quantum wells by chemical mechanical polishing.

5. The method of claim 1, wherein forming the multiple quantum wells comprises forming layers oriented, along the slanted sidewalls, at a different angle than the normal to the major surface of the waveguide.

6. A method of manufacturing an electro-optical modulator, the method comprising:
    forming a cavity extending from a first major surface of a waveguide towards a second major surface of the waveguide, the waveguide being configured to transmit light in a first direction, the cavity having sidewalls inclined with respect to the normal to the second major surface of the waveguide, and wherein a normal to the sidewalls is along a second direction orthogonal to the first direction; and
    forming multiple quantum wells within the cavity.

7. The method of claim 6, wherein forming the cavity comprises forming the cavity from the first major surface to the second major surface so that the cavity is a through cavity.

8. The method of claim 6, wherein forming the multiple quantum wells comprises forming layers oriented, along the sidewalls, at a different angle than the normal to the second major surface of the waveguide.

9. The method of claim 6, wherein the waveguide comprises a first semiconductor region and a second semiconductor region, and wherein forming the cavity comprises forming the cavity between the first semiconductor region and the second semiconductor region, the first and the second semiconductor regions being doped with different conductivity types, and wherein the first and the second semiconductor regions are made of silicon.

10. The method of claim 6, wherein forming the multiple quantum wells comprises forming alternating layers of first quantum barrier layers and second quantum well layers.

11. The method of claim 10, wherein the first quantum barrier layers are made of silicon-germanium, the second quantum well layers are made of germanium.

12. The method of claim 10, wherein each of the first quantum barrier layers and second quantum well layers is flush with the second major surface of the waveguide.

13. The method of claim 10, wherein the waveguide rests on and is in contact with a third layer, the third layer being an insulating layer of a structure of semiconductor-on insulator type.

14. The method of claim 6, further comprising forming a band configured to guide an optical signal propagating through the waveguide.

15. The method of claim 14, wherein the cavity is formed in an intermediate portion of the band.

16. A method of manufacturing an electro-optical modulator, the method comprising:
- forming a band oriented along a first direction, the band comprising an upstream portion, an intermediate portion, and a downstream portion, the first direction being along a light transmission direction of a waveguide;
- forming a first strip oriented along the first direction and disposed on a first side of the band;
- forming a second strip oriented along the first direction and disposed on a second side of the band, the band, the first and the second strips being disposed in a silicon layer of a substrate;
- forming a cavity disposed in the intermediate portion of the band, the cavity comprising slanted sidewalls, wherein a normal to the slanted sidewalls is along a second direction orthogonal to the first direction; and
- forming multiple quantum wells disposed in the cavity.

17. The method of claim 16, wherein the substrate comprises an insulator layer disposed between the silicon layer and a bulk silicon substrate, and wherein the cavity is a through cavity extending from a first major surface of the silicon layer of the substrate to a second major surface of the silicon layer of the substrate.

18. The method of claim 17, wherein forming the multiple quantum wells comprises forming layers oriented, along the slanted sidewalls, at a different angle than the normal to the second major surface of the silicon layer of the substrate.

19. The method of claim 16, wherein forming the multiple quantum wells comprises forming alternating layers of first quantum barrier layers and second quantum well layers.

20. The method of claim 19, wherein the first quantum barrier layers are made of silicon-germanium, the second quantum well layers are made of germanium.

\* \* \* \* \*